(12) United States Patent
Suzuki et al.

(10) Patent No.: US 6,618,278 B2
(45) Date of Patent: Sep. 9, 2003

(54) ELECTRIC POWER CONVERSION/INVERSION APPARATUS

(75) Inventors: Osamu Suzuki, Chiyoda (JP); Shinji Shirakawa, Hitachi (JP); Akira Mishima, Mito (JP); Toshiyuki Innami, Tsuchiura (JP); Shinichi Fujino, Mito (JP); Hideaki Mori, Chiyoda (JP); Kenji Takahashi, Abiko (JP); Keiichi Mashino, Hitachinaka (JP); Hiromichi Anan, Iwama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/810,259

(22) Filed: Mar. 19, 2001

(65) Prior Publication Data

US 2002/0034087 A1 Mar. 21, 2002

(30) Foreign Application Priority Data

Sep. 19, 2000 (JP) ........................................ 2000-283004

(51) Int. Cl.[7] .............................................. H01L 23/40
(52) U.S. Cl. ........................ 363/144; 361/687; 361/688
(58) Field of Search ................................. 363/131, 132, 363/144, 141; 361/686, 687, 688, 707

(56) References Cited

U.S. PATENT DOCUMENTS

| 4,224,663 A | * | 9/1980 | Maiese et al. ............... 363/144 |
| 5,623,399 A | * | 4/1997 | Ishii et al. ................... 363/144 |
| 6,456,029 B1 | * | 9/2002 | Akahane et al. ........ 363/132 X |

FOREIGN PATENT DOCUMENTS

| JP | 11-346480 | * | 12/1999 |
| JP | 2000-049281 | * | 2/2000 |

* cited by examiner

Primary Examiner—Jessica Han
(74) Attorney, Agent, or Firm—Antonelli, Terry, Stout & Kraus, LLP

(57) ABSTRACT

In an electric power conversion/inversion apparatus, including, such as an inverter therein, for obtaining reduction in circuit inductance and wiring resistance therein by bringing small as a whole, having good installability and high reliability and efficiency of electric power conversion, as well, semiconductor chips 1 are disposed, being put between a positive input bus bar 14p and a negative input bus bar 14n and plural output bus bars 18 at crossing positions thereof, and are connected electrically and thermally, to the positive input bus bar 14p in a pole direction consistent therewith while to the negative input bus bar 14n in a pole direction consistent therewith, and further to the common output bus bars 18 in pole directions being different from side by side.

14 Claims, 13 Drawing Sheets

ELECTRIC POWER CONVERSION/INVERSION APPARATUS

BACKGROUND OF THE INVENTION

The present invention relates to an electric power conversion/inversion apparatus, such as, an inverter, etc., and in particular to an electric power conversion/inversion apparatus, being used as a motor driving apparatus for use in an automobile, upon which a high reliability is required.

An inverter according to the conventional art 1, as was shown by a third embodiment in Japanese Patent Laying-Open No. Hei 11-346480 (1999), comprises: two power supply bus bars for inputting DC electric power from a DC power source and a capacitor; a plural number of output bus bars for outputting three-phase AC electric power to a motor; a plural number of semiconductor switching modules, being electrically connected to those power supply bus bars and the output bus bars, for inverting the DC electric power inputted into the three-phase AC electric power, to be outputted; and a heat sink on which are mounted those semiconductor switching modules, the power supply bus bars and the output bus bars.

Explanation will be given on that inverter apparatus according to the conventional art 1, in more details thereof. The plural number of the power supply bus bars comprises a positive (+) power supply bus bar and a negative (−) power supply bus bar. The plural number of the output bus bars is provided in number of three (3), so as to form three-phase thereby. The semiconductor module comprises three (3) parallel circuits, in each of which an IGBT and the reverse-parallel diode are connected, thereby forming each of the arms of a three-phase inverter. One of the phases of the three-phase bridge is formed with two (2) of the arms, and semiconductor modules constructing those two arms are provided on the heat sink through an insulator substrate, a common electrode pattern, and a high temperature soldering, so as to be disposed in parallel at both sides thereof. The output bus bars and the positive (+) power supply bus bar are provided on the heat sink, surrounding the semiconductor switching modules provided in parallel, through a insulator plate with contacting therewith. Furthermore, the negative (−) power supply bus bar is provided on the output bus bars through a insulator plate, with contacting therewith. Also, the negative (−) power supply bus bar is disposed, so as to be located in a middle of the semiconductor switching modules provided in parallel. And, the output bus bars or the power supply bus bars and the semiconductor switching modules are connected therebetween through a wire bonding.

Further, in the inverter apparatus of this conventional art 1, the semiconductor switching modules forming an inverter main circuit and the bus bars are attached on the surface of the heat sink, to be contacted with, while a cooling water path is formed on the reverse surface thereof, to cool it, thereby obtaining small-sizing and a long life-time of the inverter apparatus for an electric car.

Also, the semiconductor apparatus having the semiconductor switching elements therein, according to a conventional art 2, as shown in Japanese Patent Laying-Open No. 2000-49281, comprises: a pair of semiconductor switching elements, each having a positive electrode on one surface thereof while a negative one on the other surface; a circuit board, on which the pair of the semiconductor switching elements are mounted in different directions from each other, having a common land on which the positive electrode of one of the semiconductor switching elements and the negative electrode of the other semiconductor switching element are connected by soldering; and a wiring being positioned above the common land and extending in parallel thereto, on which the negative electrode of the one semiconductor switching elements and the positive electrode of the other semiconductor switching element are connected by soldering.

The semiconductor apparatus according to this conventional art 2 is provided for the purpose of eliminating a wiring of a shape "L" therefrom, having a component or portion extending in an orthogonal direction to the substrate, thereby to prevent inductance and/or wiring resistance from being increased due to the same wiring in the orthogonal direction to the substrate, as well as obtaining small-sizing of a package by narrowing the distance between the semiconductor switching elements.

However, with the conventional art 1, the output bus bars and the positive (+) power supply bus bar are provided surrounding the semiconductor switching modules provided in parallel, while the negative (−) power supply bus bar in the middle of the semiconductor switching modules provided in parallel, therefore a plane space of the semiconductor apparatus as a whole comes to be a total of each plane area of the semiconductor switching modules, the output bus bars, and the positive (+) and the negative (−) power supply bus bars, or more. This brings about a problem, in particular in a case where it is applied or used as the electric power inverter for use in an automobile, since the space where it is installed is very restrictive.

Also, according to the conventional art 1, the semiconductor switching modules provided in parallel and the output bus bars which is provided therealong or the power supply bus bars are connected there between by the wire bonding, therefore the wiring as a whole comes to be complex, thereby increasing the circuit inductance and the wiring resistance thereof.

Furthermore, according to the conventional art 1, since heat is radiated from the heat sink on one side of the semiconductor switching modules, the cooling of the semiconductor switching modules as a whole must be done by an amount of heat radiation through the heat sink on that one side thereof, therefore there is a problem that the heat radiation cannot be obtained with certainty. Moreover, since the semiconductor switching modules are provided on the common electrodes only through the soldering, and since, generally the semiconductor switching modules and the electrodes are different greatly in the linear expansion coefficient thereof, there is a problem that the soldering receives a large thermal fatigue from thermal cycles due to the intermittent ON-OFF operation of the semiconductor switching modules.

On a while, according to the conventional art 2, there is no description about the detailed construction for obtaining the small-sizing of the inverter apparatus as a whole, but the semiconductor switching elements and the land or the wiring are contacted only through the soldering, there is also a problem that the soldering receives a large thermal fatigue from thermal cycles due to the intermittent ON-OFF operation of the semiconductor switching elements.

SUMMARY OF THE INVENTION

An object, according to the present invention, is to provide an electric power conversion/inversion apparatus, achieving reduction in the circuit inductance and the wiring resistance thereof, while bringing the apparatus to be compact in sized as a whole, thereby obtaining an electric conversion/inversion apparatus having a good installation, as well as a high reliability and an efficiency in the electric power conversion/inversion.

Other object, according to the present invention, is to provide an electric power conversion/inversion apparatus, achieving reduction in the circuit inductance and the wiring resistance thereof, and also mitigating the thermal fatigue against the thermal cycles, while bringing the apparatus to be compact in sizes as a whole, thereby obtaining an electric conversion/inversion apparatus having a good installation, as well as a high reliability and an efficiency in the electric power conversion/inversion.

Further other object, according to the present invention, is to provide an electric power conversion/inversion apparatus, achieving reduction in the circuit inductance and the wiring resistance thereof, and also protecting the electrode surfaces of the semiconductor chips from deterioration due to elapse of time, while thereby obtaining an electric conversion/inversion apparatus having a good installation, as well as a high reliability and an efficiency in the electric power conversion/inversion.

According to the present invention, for accomplishing any one of the above objects, firstly, there is provided an electric power conversion/inversion apparatus, comprising: a plural number of input bus bars for inputting electric power from an outside; a plural number of output bus bars for outputting electric power to the outside; and a plural number of semiconductor chips, being electrically connected to said input bus bars and said output bus bars for converting/inverting the electric power inputted into an output, wherein said plural number of input bus bars include a positive input bus bar and a negative input bus bar, being provided extending in parallel to each other, while said plural number of output bus bars are provided extending in parallel to each other and crossing over said positive and said negative input bus bars in longitudinal directions thereof, said plurality of semiconductor chips are disposed, being put between said positive input bus bar or said negative input bus bar and said plurality of output bus bars at crossing positions thereof, and connected electrically and thermally, to said positive input bus bar in a pole direction consistent therewith while to said negative input bus bar in a pole direction consistent therewith, and further to said common output bus bars in pole directions being different from side by side.

More preferably, in the electric power conversion/inversion apparatus, as defined in the above, said positive input bus bar and said negative input bus bar are elongated in a manner of a straight line and disposed in parallel to each other upon a same plane, while said output bus bars are elongated in a manner of a straight line and disposed in parallel to each other upon a same plane, so that said output bus bars cross over said positive and said negative input bus bars at about right angles, in the longitudinal directions thereof.

Also, more preferably, in the electric power conversion/inversion apparatus, as defined in the above, said positive input bus bar and said negative input bus bar are connected to a positive input terminal and a negative input terminal, being formed in a laminated manner, from a side being same in the longitudinal direction thereof, respectively, while said plural number of output bus bars are connected to output terminals, respectively, from a side being same thereto but different from that of the positive and the negative input terminals, in the longitudinal direction thereof.

Also, more preferably, in the electric power conversion/inversion apparatus, as defined in the above, said semiconductor chips, each one being constructed with a MOSFET having a semiconductor switching element and a diode connected thereto in reverse-parallel direction, are connected between said input bus bars and said output bus bars, while said output bus bars being formed three in number, so that said semiconductor chips form a three-phase bridge, thereby inverting DC electric power inputted into three-phase AC electric power.

Secondly, according to the present invention, for accomplishing any one of the objects mentioned above, there is provided an electric power conversion/inversion apparatus, comprising: a plural number of input bus bars for inputting electric power from an outside; a plural number of output bus bars for outputting electric power to the outside; and a plural number of semiconductor chip carriers, being electrically connected to said input bus bars and said output bus bars for converting/inverting the electric power inputted into an output, wherein said plural number of input bus bars include a positive input bus bar and a negative input bus bar, being provided extending in parallel to each other, while said plural number of output bus bars are provided extending in parallel to each other and crossing over said positive and said negative input bus bars in longitudinal directions thereof, said plurality of semiconductor chip carriers, each having a semiconductor chip including a semiconductor switching element therein and a metal member being electrically and thermally connected to a positive surface and a negative surface on both sides of said semiconductor chip, are disposed, being put between said positive input bus bar or said negative input bus bar and said plurality of output bus bars at crossing positions thereof, and connected electrically and thermally, to said positive input bus bar in a pole direction consistent therewith while to said negative input bus bar in a pole direction consistent therewith, and further to said common output bus bars in pole directions being different from side by side.

More preferably, in the electric power conversion/inversion apparatus, as defined in the above, said metal member is formed of a low thermal expansion metal material having a low linear thermal expansion coefficient being near to that of said semiconductor chip, and is connected to said semiconductor chip through a bonding material.

Also, more preferably, in the electric power conversion/inversion apparatus, as defined in the above, said metal member is formed of a low thermal expansion metal material having a low linear thermal expansion coefficient within a range from 3 to 10.

Also, more preferably, in the electric power conversion/inversion apparatus, as defined in the above, a projection portion and an engagement portion of said semiconductor chip carrier and said input bus bar or said output bus bar are engaged, thereby providing a positioning mechanism for fixing both positions.

Also, more preferably, in the electric power conversion/inversion apparatus, as defined in the above, said metal member has an area being larger than that of a projection area of said semiconductor chip, and a thickness thereof is thin, around from 1 mm to 2 mm in thickness thereof.

Thirdly, according to the present invention, for accomplishing any one of the objects mentioned above, there is provided an electric power conversion/inversion apparatus, comprising: a plural number of input bus bars for inputting electric power from an outside; a plural number of output bus bars for outputting electric power to the outside; a plural number of semiconductor chip carriers, being electrically connected to said input bus bars and said output bus bars for converting/inverting the electric power inputted into an output; and a suppression mechanism for suppressing said input bus bars and said output bus bars onto said semiconductor chip carriers, wherein said plural number of input bus bars include a positive input bus bar and a negative input bus bar, being provided extending in parallel to each other, while said plural number of output bus bars are provided extending in parallel to each other and crossing over said positive and said negative input bus bars in longitudinal directions thereof, said plurality of semiconductor chip carriers, each having a semiconductor chip including a semiconductor switching element therein and a low thermal expansion metal member being electrically and thermally connected to a positive surface and a negative surface on both sides of said semiconductor chip, are disposed, being put between said positive input bus bar or said negative input bus bar and said plurality of output bus bars at crossing positions thereof, and connected electrically and thermally, to said positive input bus bar in a pole direction consistent therewith while to said negative input bus bar in a pole direction consistent therewith, and further to said common output bus bars in pole directions being different from side by side.

More preferably, in the electric power conversion/inversion apparatus, as defined in the above, a ratio between a width and a thickness of said input bus bar is set within a range from 5 to 10.

Fourthly, according to the present invention, for accomplishing any one of the objects mentioned above, there is provided an electric power conversion/inversion apparatus, comprising: a plural number of input bus bars for inputting electric power from an outside; a plural number of output bus bars for outputting electric power to the outside; a plural number of semiconductor chip carriers, being electrically connected to said input bus bars and said output bus bars for converting/inverting the electric power inputted into an output; a case for having said and semiconductor chip carriers built-in; and a cooler for cooling said plural number of input bus bars or said plural number of output bus bars, wherein said plural number of input bus bars and said plural number of output bus bars are provided so that they intersect to each other, said plurality of semiconductor chip carriers, each having a semiconductor chip including a semiconductor switching element therein and a metal member being electrically and thermally connected to a positive and a negative surfaces on both sides of said semiconductor chip, are disposed to be put between said input bus bars and said plurality of output bus bars, at crossing positions thereof, being connected electrically and thermally, to said positive input bus bar in a pole direction consistent therewith while to said negative input bus bar in a pole direction consistent therewith, and further to said common output bus bars in pole directions being different from side by side, said case, being made of plastic as a whole, is molded with said input bus bars or said output bus bars in one body with exposing surfaces thereof on anti-semiconductor side, when being formed from the plastic, and said cooler is disposed on an outside said case, being connected thermally to a surface of the anti-semiconductor side, on which said input bus bars or said output bus bars are exposed, through an electric insulator layer.

More preferably, in the electric power conversion/inversion apparatus, as defined in the above, suppression mechanisms are provided onto said input bus bars or said output bus bars, which are molded with said case in one body, so as to suppress said output bus bars or said input bus bars.

DETAILED DESCRIPTION OF PREFERRED EMBODIMENTS

Hereinafter, embodiments according to the present invention will be fully explained by referring to the attached drawings. However, with the embodiments after a second one, the structures or elements, which are common with those of the first embodiment, will be omitted in figures, as well as duplicate explanation thereof. Reference numbers or marks, being same to those in each embodiment, indicate the same things or elements and/or those corresponding thereto.

Figure 23:
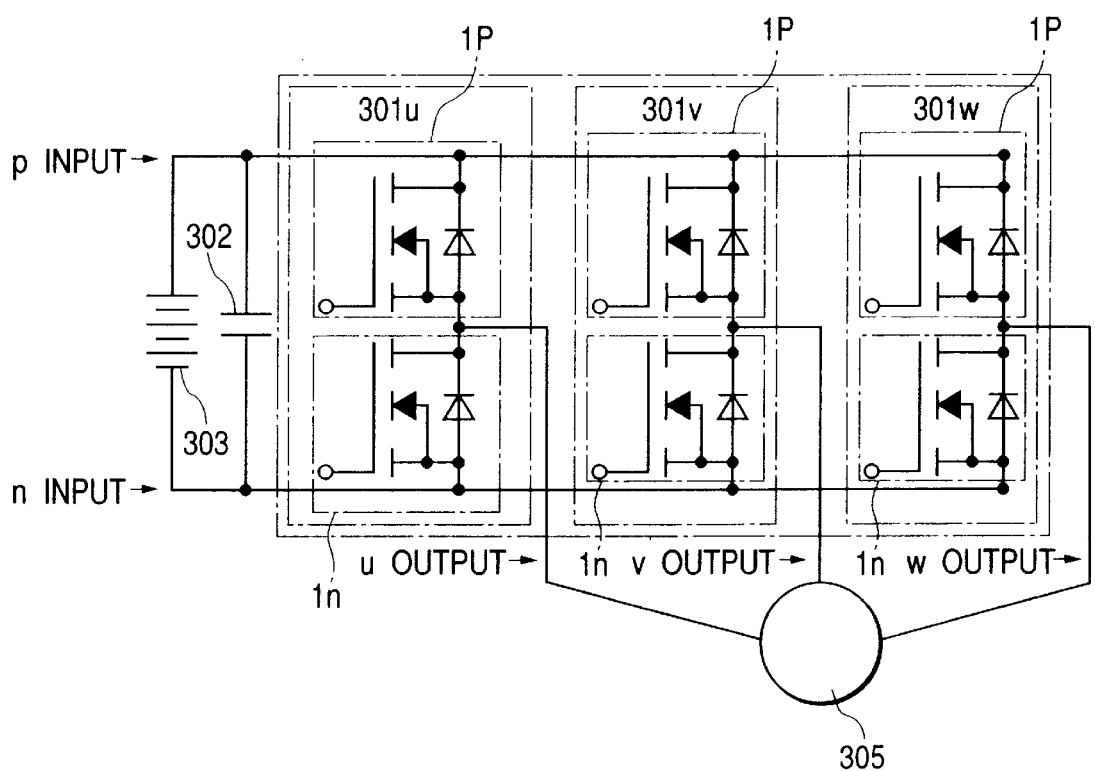
FIG. 23 is a circuit diagram of the electric power conversion/inversion apparatus in a motor driver system for use in an automobile, into which is applied the electric power conversion/inversion apparatus, according to the various embodiments of the present invention.

First of all, explanation will be given on an electric power conversion/inversion apparatus in a motor driver system for use in an automobile, into which can be applied each of the electric power conversion/inversion apparatuses according to the various embodiments of the present invention, by referring to FIG. 23. The FIG. 23 is a circuit diagram for showing the electric conversion/inversion apparatus in a motor driver system for use in an automobile.

In the electric power conversion/inversion apparatus according to the present embodiment, DC current from a battery 303 is changed or inverted into AC current through an inverter circuit 306, being variable in voltage and frequency thereof, so as to control an AC three-phase electric rotating machine 305. Battery voltage in the present embodiment is set to around 42V obtained by connecting batteries in series, for example, in number of three (3), each having an output of 14V and is widely and commonly used in a car, by taking the fact that endurance voltage of a semiconductor chip 1 constructed with MOSFET (Metal Oxide Semiconductor Field Effect Transistor) is around 100V at the maximum into the consideration.

On a DC side of the inverter circuit 306 is connected a filter capacitor 302 for removing ripple components on the DC current from the battery 303. Also, a main circuit of the inverter circuit 306 is constructed with three (3) sets of circuits, 301u, 301v and 301w, each generating an output of one phase of the three-phase AC current, being connected in parallel to a DC input. In the drawing, suffixes "u", "v" and "w" are attached after the reference numerals or marks for the purpose of distinction among the three (3) phases thereof, however there are cases where those suffixes "u", "v" and "w" are omitted, in particular when they are indicated commonly or representatively, in the explanation given below. A circuit 301 for one (1) phase is constructed with a positive semiconductor chip 1p for generating an output of a plus side with respect to a reference electrical potential and a negative semiconductor chip In for generating an output of a minus side, being connected in series as one set, thereby changing DC current inputted into pulses having three levels, i.e., a positive one, a negative one and a neutral one. In the drawing, suffixes "p" and "n" are attached after the reference numerals or marks for the purpose of distinction between the positive and the negative thereof, however there are cases where those suffixes "p" and "n" are omitted, in particular when they are indicated commonly or representatively, in the explanation given below. By means of the three sets of circuit 301u, 301v and 301w mentioned above, PWM modulated three-phase AC current, being variable in voltage and frequency thereof, is outputted from the inverter circuit 306.

The electrical rotating machine 305, herein, is used as an electric motor for use in an automobile. When this electrical rotating machine 305 is to be operated as the electric motor, the three-phase AC current of variable voltage and frequency is inputted to it, thereby controlling the rotation thereof so as to generate motive power therefrom. However, it is also possible to use the electrical rotating machine 305, so as to operate as a generator or a dynamo, and during regenerative operation, on the contrary to the operation mentioned above, energy generated thereby flows into the battery 303 to be charged therein.

In the electric power conversion/inversion apparatus explained in the above, heat-generative electrical parts are mainly the semiconductor chips 1, and there is a necessity of protecting the semiconductor chips 1 from an increase of temperature by using a heat radiation means, so that the temperature does not exceed a heat-durable temperature of the semiconductor chip 1. Also, thermal resistance of an inverter module, in which the semiconductor chips 1 are installed or mounted, occupies a large part of ratio to a total thermal resistance. Therefore, the inverter module installing the semiconductor chips therein is required to be lowered in the thermal resistance in the structure thereof.

Also, the electric power conversion/inversion apparatus used in an automobile is mainly operated to supply electric energy at frequent, for the purpose of flowing large current in a short time period, for example, when supplying the electric energy so as to assist an engine generating a torque therefrom through the electrical rotating machine 305 in the short time period, and when supplying the electric energy so as to drive the engine through the electrical rotating machine 305 when it starts up by itself. Because of this, the electric power conversion/inversion apparatus, and in particular the semiconductor chips 1 generating heat therefrom receives very severe thermal cycles. Therefore, it is necessary to protect the inverter module from thermal fatigue and breakdown thereof, due to the heat cycles given intermittently for a long time. For that reason, the module is required to be strong against the thermal cycles in the structure thereof.

Also, the endurance voltage of the semiconductor chip 1 is about 100V, in general, therefore it is only as two (2) times large as the battery voltage if it is set to 42V in the manner of the present embodiment. Under such the condition of use, when the circuit inductance is large, there is a possibility that the voltage jumping up when being switched comes up to be so large as to break down the semiconductor chip 1. Therefore, the inverter is required to have a low circuit inductance in the structure thereof.

The present invention is made for satisfying such the requirements mentioned in the above.

Figure 1:
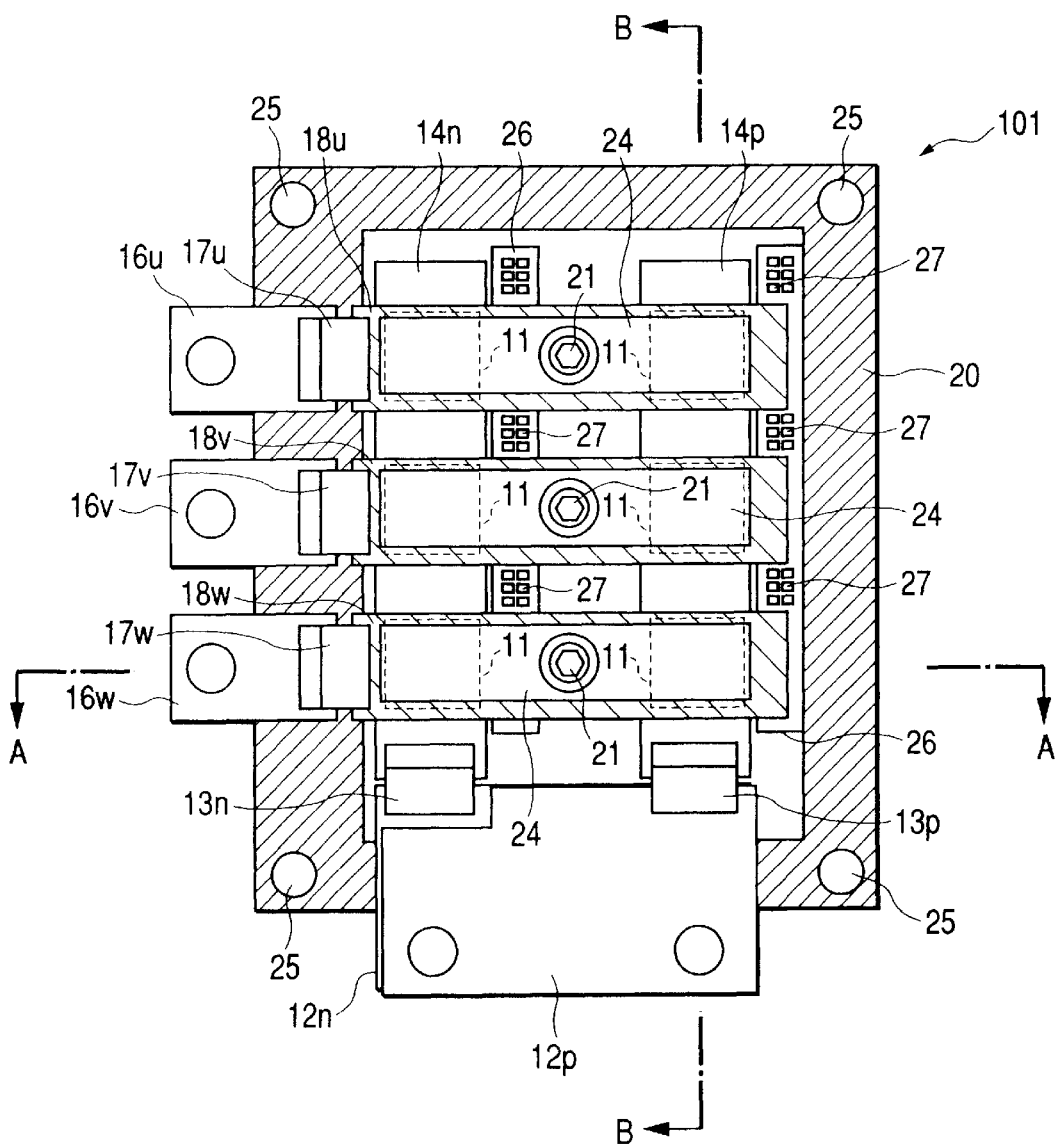
FIG. 1 is a cross-section view for showing the structure of an electric power conversion/inversion apparatus, according to a first embodiment of the present invention.
Figure 2:
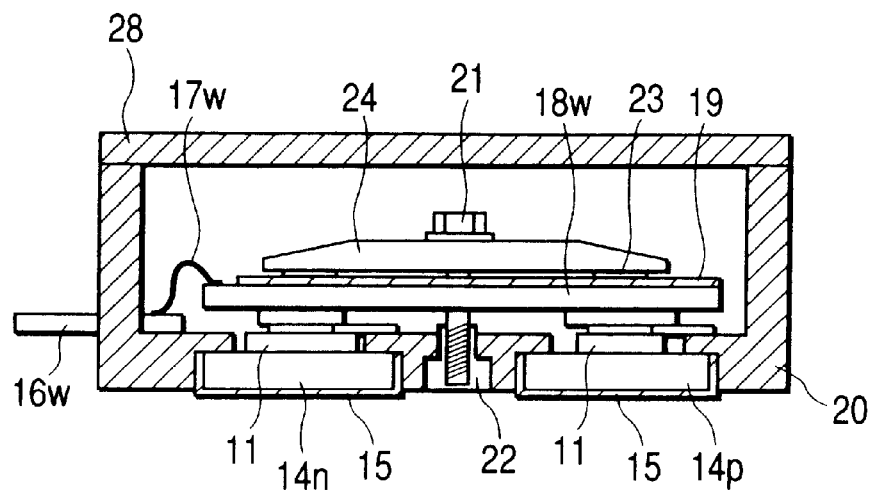
FIG. 2 is a cross-section view along A—A plane shown in the FIG. 1.
Figure 3:
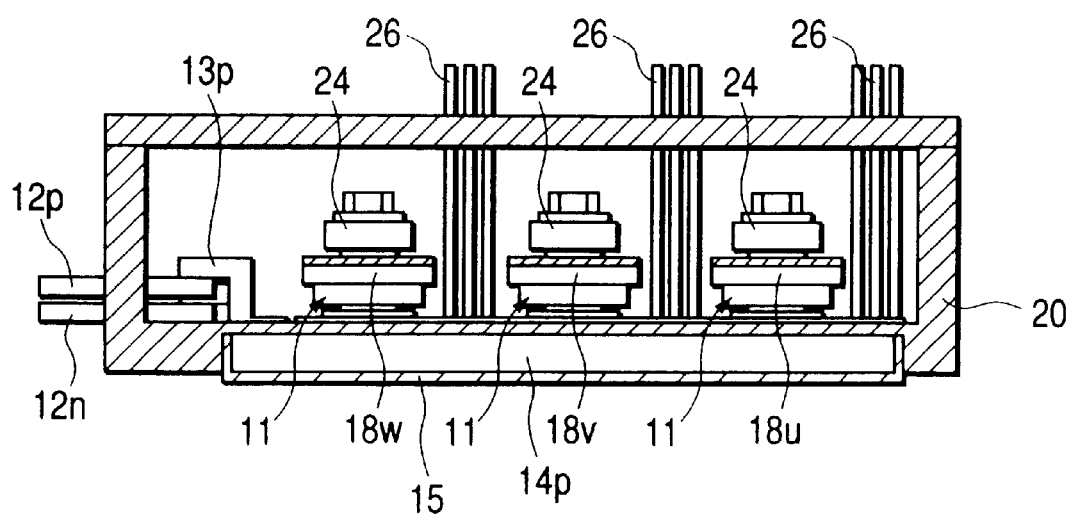
FIG. 3 is a cross-section view along B—B plane shown in the FIG. 1.
Figure 4:
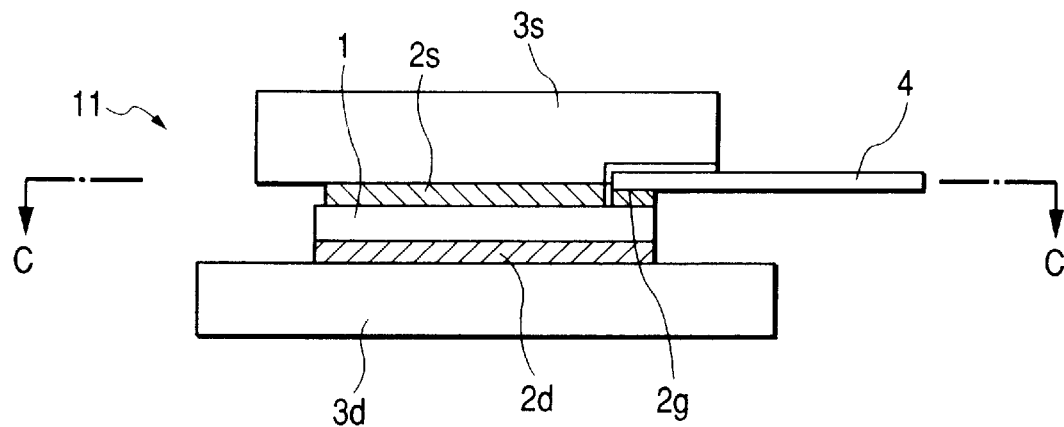
FIG. 4 is a cross-section view, being orthogonal to a laminating direction of a chip carrier 11 shown in the FIG. 2.
Figure 5:
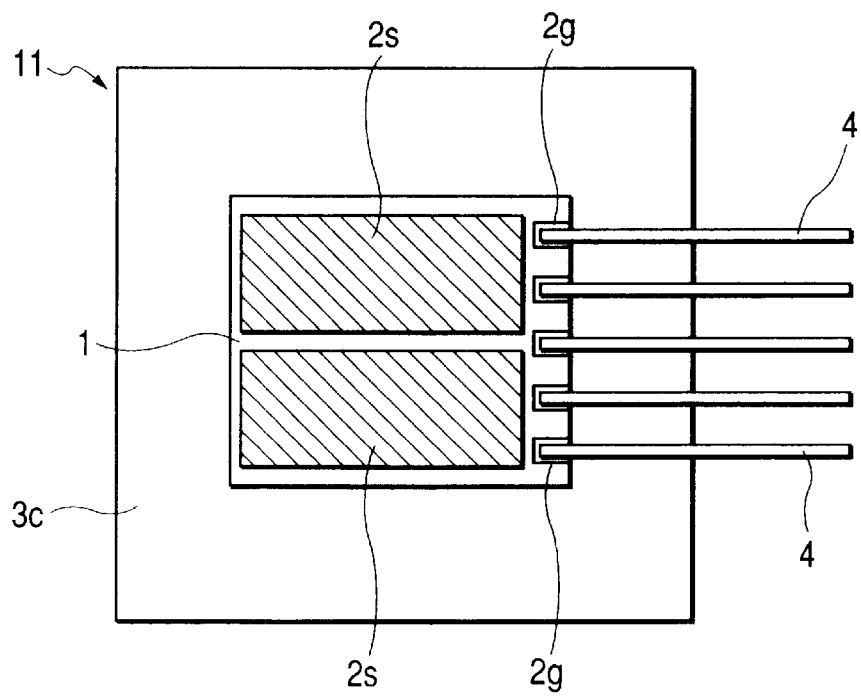
FIG. 5 is a cross-section view along C—C plane shown in the FIG. 4.
Figure 6:
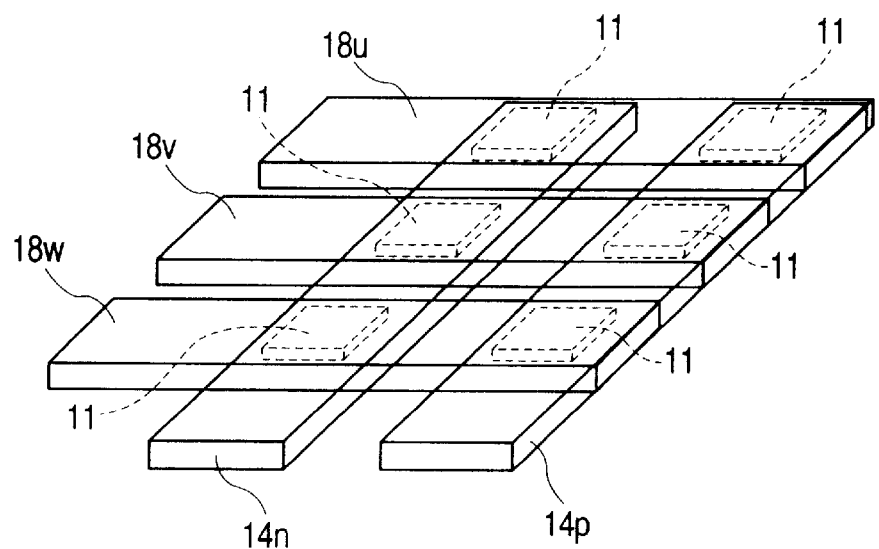
FIG. 6 is a perspective view of main circuit wirings and the chip carriers being extracted from, in the first embodiment according to the present invention.
Figure 7:
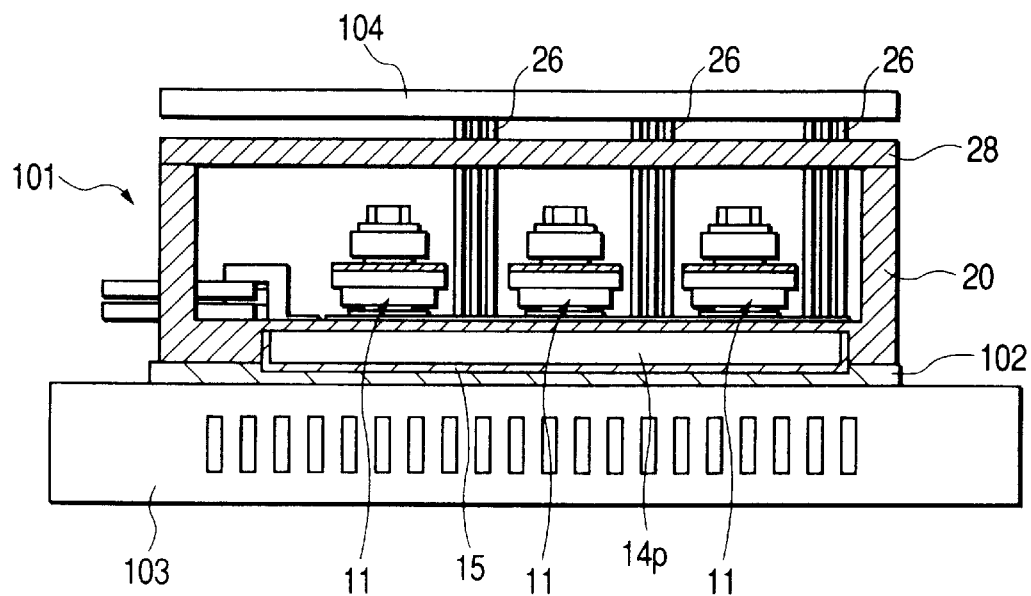
FIG. 7 is a view of the construction of the electric power conversion/inversion apparatus and peripheral equipments thereof, according to the first embodiment of the present invention.

Next, explanation will be given on a first embodiment of the electric power conversion/inversion apparatus, according to the present invention, by referring to attached FIGS. 1 to 7, wherein FIG. 1 is a cross-section view for showing the structure of an electric power conversion/inversion apparatus, according to a first embodiment of the present invention; FIG. 2 is across-section view along A—A plane shown in the FIG. 1; FIG. 3 is a cross-section view along B—B plane shown in the FIG. 1; FIG. 4 is a cross-section view, being orthogonal to a lamination direction of a chip carrier 11 shown in the FIG. 2; FIG. 5 is a cross-section view along C—C plane shown in the FIG. 4; FIG. 6 is a perspective view of main circuit wirings and the chip carriers being extracted from, in the first embodiment according to the present invention; and FIG. 7 is a view of the construction of the electric power conversion/inversion apparatus and peripheral equipments thereof, according to the first embodiment of the present invention, respectively.

First, explanation will be given about the structure of the chip carriers 11 by referring to the FIGS. 4 and 5. The chip carrier 11 is constructed to have the semiconductor chip 1 and metal members 3s and 3d having low thermal expansion, being bonded through bonding members (for example, solder, etc.) 2s and 2d on the surfaces of both sides thereof. In the FIG. 4, an upper surface of the semiconductor chip 1 is an electrode surface on a source side, while a lower surface is an electrode surface on a drain side thereof. In the drawing, a suffix "s" is attached after a member located on the source side while "d" after a member located on the drain side, however there are cases where they are omitted, in particular when they are indicated commonly or representatively, in the explanation given hereinafter. Herein, the low thermal expansion metal means a metal having a small coefficient of linear thermal expansion, being same or similar to that of silicon (about 3), which is used as a material of the semiconductor chip 1, for example, molybdenum having the linear thermal expansion coefficient of about 5 or alloy of copper oxide having the linear thermal expansion coefficient of about 10 or the like can be used.

Regarding the electrode surface on the source side of the semiconductor chip 1, since a plural number of control electrodes and sensor electrodes must be taken out from this electrode surface, other than main circuit current, etc., the area of the surface of the source electrode, being contactable with the wiring, comes to be smaller than the front surface by that portion. Further, a control terminal 4 for taking out a signal from a control electrode is electrically connected to the control electrode of the semiconductor chips 1 through a bonding member 2g of, such as, solder, etc.

On the contrary to this, since the main circuit current flows through the electrode surface on the drain side of the semiconductor chip 1, over a whole area thereof, the whole surface is connected to the low thermal expansion metal member 3d through the bonding member (for example, of solder, silver paste, etc.) 2d.

For the purpose of diffusion of heat generated from the semiconductor chip 1 into a direction of a plane, preferably the low thermal expansion metal member 3 is formed into such sizes, that it has an area larger than the projection area of the semiconductor chip 1 thereon. Also, with thickness thereof, it is preferably to be set from about 1 mm to about 2 mm, by taking into the consideration that the thermal resistance component comes to be too large in the vertical direction, comparing to the effect obtained as a thermal diffusion plate, if it is too thick, and that the low thermal expansion metal member 3 is, in general, made of an expensive material.

Next, explanation will be given on the structure of the inverter module, including the chip carriers 11 and the layout of those bus bars constructing an input/output circuit plate therein, by referring to FIGS. 3, 6 and 7.

First, two input bus bars 14p and 14n are disposed in parallel, extending in the longitudinal direction thereof along with each other. In the drawing, suffixes "p" and "n" are attached after the reference numerals or marks for the purpose of distinction between the positive and the negative, however there are cases where those suffixes "p" and "n" are omitted, in particular when they are indicated commonly or representatively in the explanation given below. Those input bus bars 14 are made of a material, such as copper or aluminum.

And, a side surface of the positive input bus bar 14p, having no contact with the chip carrier 11, is disposed within a case 20 to be exposed from a lower surface thereof, functioning as a cooling surface, upon which the case is attached on the metal-made heat sink 103 (see FIG. 7) which constructs a cooler. The case 20 is made by mold forming of resin, etc., and is molded together with the positive input bus bar 14p and the negative input bus bar 14n as one or in one body; therefore they are fixed onto the base 20. Because of contact with the metal-made heat sink 103, cooling side surfaces of the positive input bus bar 14p and the negative input bus bar 14n are formed with an insulator layer 15 thereon, for the purpose of ensuring electric insulation, made of resin containing mainly epoxy, etc., or ceramic powder, for example. Also, the positive input bus bar 14p and the negative input bus bar 14n are molded with the case 20 in one body, however in the construction thereof, the case 20 exposes not only the cooling surface upon which it contacts with the cooler 103 through the insulator layer 15, but also an upper surface thereof for contacting with the chip carrier 11. However, the heat sink 103 is attached, with contacting onto the cooling side surfaces of the positive input bus bar 14p and the negative input bus bar 14n, by using a fixing bore 25 opened in the module case 20 and a bolt not shown in the figure. In this instance, for the purpose of reduction in the contact thermal resistance between them, thermal conductive grease 102 is put into an opening or aperture defined between the insulator layer 15 on the cooling side surfaces of the positive and negative input bus bars 14p and 14n and the heat sink 103.

On the positive input bus bars 14p are disposed three (3) chip carriers 11, each contacting the drain side onto the positive input bus bar 14p, so as to be electrically connected therewith, and they are aligned in the longitudinal direction thereof. On a while, on the negative input bus bar 14n are disposed three (3) chip carriers 11, in the same manner, however each contacting the source side onto the negative input bus bar 14n, so as to be electrically connected therewith, and they are aligned in the longitudinal direction thereof.

Further, over one of the chip carriers 11 on the positive input bus bar 14p and one of the chip carriers 11 on the negative input bus bar 14n, the output bus bars 18 are disposed on upper surfaces thereof, while being connected electrically. Those output bus bars 18 are disposed so that they intersect the input bus bars 14 at about right angles to each other, with respect to the longitudinal directions thereof. Such combinations of the chip carriers 11 are three (3) in the number thereof, in total, and the output bus bars 18 are disposed in a pair on each of the chip carriers 11.

Onto the laminated layer structure of the chip carriers 11, input bus bars 14 and the output bus bars 18 mentioned above, as shown in FIG. 2, there is further laminated a suppression body 24 upon the upper surface of the output bus bars 18. In the laminated structure of those, the suppression body 24 has a bore in a center thereof, and into this bore is inserted a joint means (for example, a screw, etc.) 21 penetrating therethrough, wherein joining the joint means 21 into the female screw portion 22 which is provided within the case 20 molding the input bus bars 14 in one body. With this, the chip carriers 11 are suppressed by means of the input bus bars 14 and the output bus bars 18 to be connected with, thereby obtaining the electrical and thermal connection between them with certainty. Between the input bus bars 14 and the suppression body 24, however, there is inserted an insulator layer 19 and an elastic body 23, such as a disc spring, etc., for the purpose of protecting the suppression from abrupt decrease due to loosing of the screw 21, etc.

The input bus bars 14p and 14n are, as apparent from FIG. 1, connected to a positive and a negative input terminals 12p and 12n which are formed with the case 20 in one body through wiring members 13p and 13n for use in connection. Herein, for the purpose of reducing the inductance therein, the positive and the negative input terminals 12p and 12n are located close to each other, so far as the insulation can be ensured on both wiring surfaces thereof, i.e., in a form of the laminated structure. However, depending upon the form of the input bus bars 14, it is possible to eliminate the wiring members 13, thereby to be constructed with the input terminals 12 in one body. The output bus bars 18u, 18v and 18w are connected to output terminals 16u, 16v and 16w, which are also formed with the case 20 in one body, through wiring members 17u, 17v and 17w.

The control terminals 4 to be taken out from each chip carrier 11 are connected to control wiring bodies 26 which are disposed on the case 20, and further through control terminal pins 27, which are formed on those wiring bodies 26, control signals are taken out upon the upper surfaces of the modules. Above the upper surfaces of the modules is disposed a controller substrate 104 (see FIG. 7) in the vicinity thereof, and control pins 27 are connected thereto.

Next, explanation will be given about functions and effects obtained with the structure of the embodiment mentioned above.

First, explanation will be given on the functions and the effects, seeing from the circuit inductance thereof.

The inverter circuit, being applied into the present embodiment for taking out three-phase AC output from the DC power source having the positive and negative poles, is most simple in the structure thereof. Namely, the polarities of the chip carriers 11 which are mounted on the positive and the negative input bus bars 14p and 14n are made different to each other, and to those are electrically connected the AC output bus bars 18, thereby constructing the inverter circuit for one phase. Further, by disposing the output bus bars 18 so that the longitudinal direction thereof intersects at the about right angles with respect to longitudinal direction of the input bus bars, i.e., the direction in which the chip carriers 11 are aligned thereon, it is possible to dispose in the most compact form the output bus bars 18 for those three phases. Of course, this configuration can contribute, not only to small-sizing of the inverter module, but also enables a low inductance of the circuit as a whole, since no such a current component occurs at all other than the portions of the chip carriers 11 that intersects the input wiring at the right angles, but occurs necessarily when all the chip carriers 11 are installed in the same polarity, therefore there is no necessity of increasing up the endurance voltage for the elements more than the value required from a circuitry viewpoint. Also, the resistance of the semiconductor element must not be larger than the necessary value thereof, and this enables an improvement in an efficiency of electric power conversion/inversion as the basic performance of the inverter circuit.

Next, explanation will be given on the functions and the effects, from a viewpoint of reliability of the module structure.

In the present embodiment, the chip carriers 11 are obtained by bonding onto the semiconductor chips 1 the low thermal expansion metal member 3, having the linear thermal expansion coefficient thereof. With this, it is possible to protect the solder bonding portion from the thermal fatigue and destruction due to the thermal cycles.

Also, as the material for constructing the output bus bars 18, it is general to use a metal material, having a large linear thermal expansion coefficient (about 20) comparing to that of the semiconductor chip 1 and the low thermal expansion metal member 3, such as copper or aluminum, and in this instance, since the output bus bars 18 are pressingly contacted upon the surface of the low thermal expansion metal members 3 of the chip carriers 11, it is possible to protect the bonding portions from the fatigue and destruction caused due to inconsistency in the linear thermal expansion coefficient between the semiconductor chip 1 and the low thermal expansion metal member, and the output bus bars 18. In such suppressive contact structure, it is preferable to obtain reduction, in particular, in contact thermal resistance, by treating a solder layer of a soft metal, such as silver, or by inserting a soft metal foil onto the contact surfaces. Constructing such the partial bonding and/or partial suppressive contact structure as mentioned above, by utilizing the bus bars 18 forming the electric wirings as-the suppression members, achieves the structure for obtaining both the low inductance and thermal durability thereof.

Furthermore, with air-tightness of the inverter module, since it adopts the bonding structure, in which the low thermal expansion metal member 3 is bonded upon the electrode surfaces of the semiconductor chip 1, being basically most sensitive in contaminated circumferences, so as to cover them, it is possible to protect the electrode portions of the semiconductor chip 1 from the deterioration due to the elapse of time. With this, since there is no need of applying such the complete sealing structure that is necessary in the suppressive contact structure according to the conventional art, the inverter module can be more simplified in the structure thereof, and as a result enable to lower the costs. With the present embodiment, injecting inside the inverter module with sealing material, such as gel or resin, which is frequently used in the common inverter module having such the bonding structure, and/or applying a filler on the exposing surfaces of the chip carriers 11 other than the solder bonding portions, brings the structure to be fully explosion-proof or -free.

Figure 8:
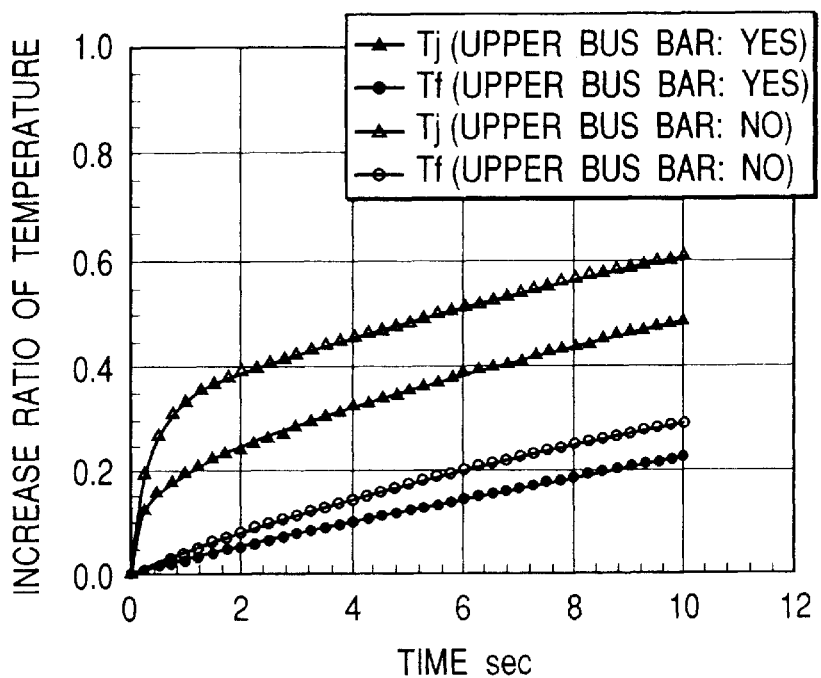
FIG. 8 is a graph for showing characteristic curves of temperatures of the semiconductor chip and on the surface of a heat sink in the electric power conversion/inversion apparatus, according to the first embodiment of the present invention.

Next, explanation will be given on the functions and the effects, from a viewpoint of cooling characteristic in the structure of the inverter module. The present mount structure is a one-side cooling structure, having the cooling surface only on one side, however the low thermal expansion metal member 3 and the output bus bars 18 performs the function as a thermal storage when conduction time is short, therefore it has a feature that transitional thermal resistance can be made small comparing to the normal one-side cooling structure. In FIG. 8, as an example for showing the feature in more detail, calculated results are shown of the transitional increases in temperatures, i.e., the temperature Tj of the semiconductor chip and the temperature Tf of the heat sink in a case where copper bus bars, each having the thickness of 2 mm and the width of 15 mm, are used as the output bus bars 18, being normalized by a chip temperature under a normal condition. According to the present calculation, contrarily to a case where the output bus bars 18 are not provided on the upper surface of the non-cooling surface, it can be seen that the transitional increases in temperatures of the semiconductor chip 1 and the cooler 103, during a period of ten (10) seconds from the starting of heat generation, show values being smaller than those by about 20% thereof. Such the feature functions effectively, in particular when it is applied into the control for, such as, an automobile appliance or a motor for use in an automobile, which is mainly used at rating thereof for a short time. Also, in the present embodiment, two input bus bars 14p and 14n are used as the cooling surface, and this is because it is possible to ensure the width of them to be wider than the width of the bus bars obtainable when the three (3) output bus bars 18 are fixed totally in the direction of the width thereof as the cooling surface, and as a result of this, the thermal resistance can be reduced down much more.

Also, according to the present mounting structure, there lies the contact thermal resistance between the chip carriers 11 and the input bus bars 14, however this contact thermal resistance can be reduced down to a degree corresponding to the solder layer of thickness around 0.1 mm, under a pressure within a limit of suppression upon the semiconductor 1.

Figure 9:
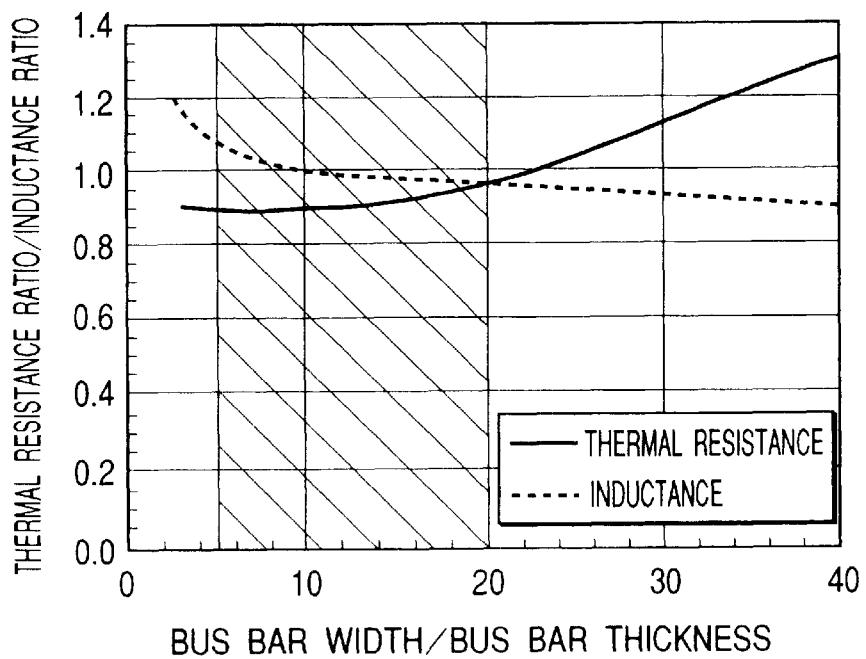
FIG. 9 is a graph for showing characteristic curves of thermal resistance and inductance with respect to a ratio between width and thickness of an input bus bar in the electric power conversion/inversion apparatus, according to the first embodiment of the present invention.

As was mentioned in the above, since they give a large influence upon the cooling performance while also a large influence upon the circuit inductance, the input bus bars 14 must be designed optimizing in the sizes thereof. In FIG. 9 are shown results of the thermal resistances and the inductances, which are calculated out by making the ratio between the width of the input bus bar and the thickness as a parameter thereof, when setting the width of the input bus bar at a constant value. On the vertical axis of this graph are indicated relative values, obtained through normalization of the respective values by allowable design values. According to this, the smaller the thickness of the input bus bar, the lower the inductance, however the thermal resistance shows a tendency of increasing up, thereby reducing the function as the heat or thermal diffusing plate. On the contrary, the thicker the thickness of the input bus bar, the higher the inductance. By taking those tendencies into the consideration, it can be seen that an appropriate range in the ratio of the bus bar lies preferably in the range from about 5 to about 20 in the ratio, between the width and the thickness of the input bus bar.

Though in the present embodiment was given the explanation in the case where the MOSFET is applied into, of course, the same effects shown heretofore can be obtained when applying other switching elements, including IGBT, etc. Furthermore, when applying the semiconductor-switching element made of the material, SiC, since it can achieves high-temperature structure due to a great feature of the SiC that it enables high-temperature operation therewith, it is possible to obtain the small-sizing of the semiconductor chip 1, and further of the cooler 103.

Figure 10:
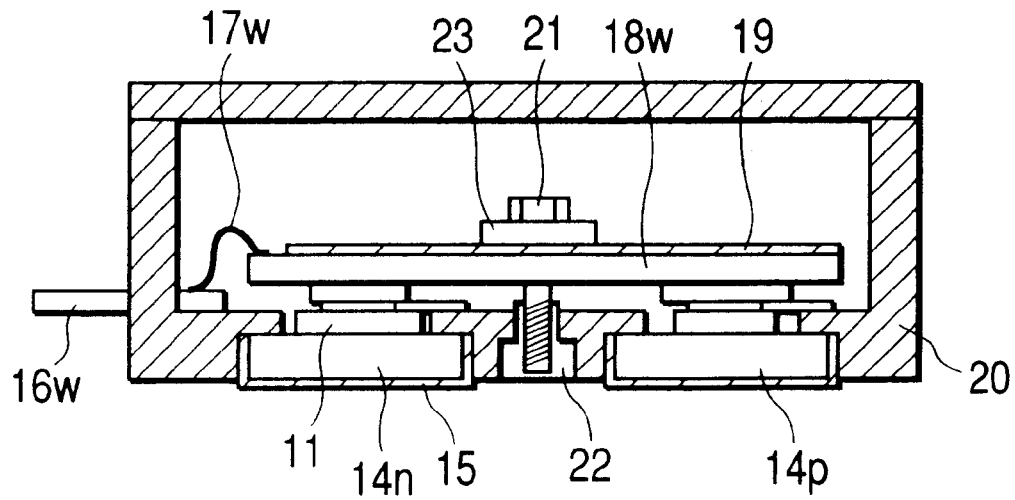
FIG. 10 is a cross-section view for showing the structure of an electric power conversion/inversion apparatus, according to a second embodiment of the present invention.

Next, explanation will be given on a second embodiment of the electric power conversion/inversion apparatus according to the present invention, by referring to FIG. 10. The FIG. 10 is a cross-section view for showing the structure of the electric power conversion/inversion apparatus, according to the second embodiment of the present invention.

According to the present embodiment, the elastic body 23, such as a disc spring, etc., is inserted between the bolt 21 and the output bus bar 18. With this, since the output bus bar 18 functions also as the suppression body by itself, in common, in place of the suppression body 24 that is necessary in the first embodiment, it is possible to achieve the suppressive contact structure being simplified in the structure thereof.

Figure 11:
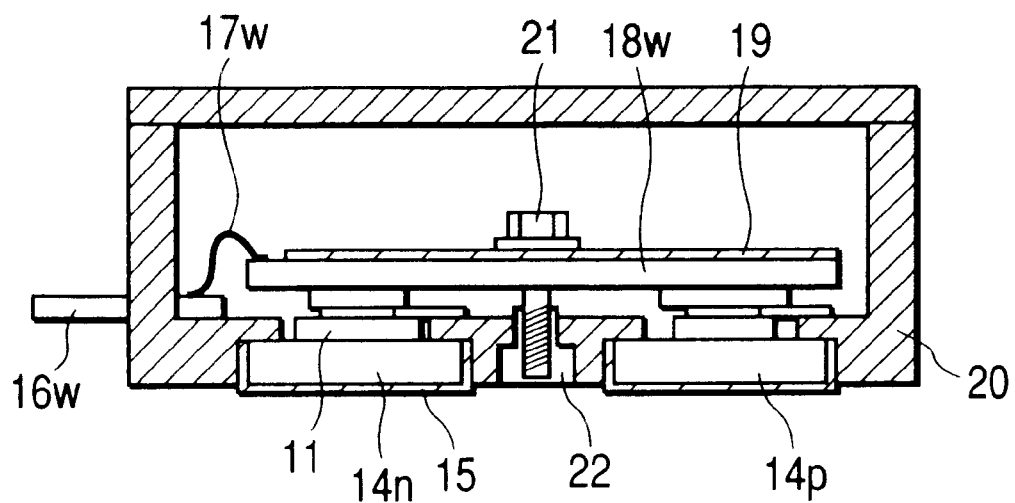
FIG. 11 is a cross-section view for showing the structure of an electric power conversion/inversion apparatus, according to a third embodiment of the present invention.

Next, explanation will be given on a third embodiment of the electric power conversion/inversion apparatus according to the present invention, by referring to FIG. 11. The FIG. 11 is a cross-section view for showing the structure of the electric power conversion/inversion apparatus, according to the third embodiment of the present invention.

According to the present embodiment, the elastic body 23 is eliminated in the second embodiment, and the output bus bar 18 serves both as the elastic body and as the suppression body, and as the output bus bar 18, as well, by itself, commonly in the construction thereof, thereby achieving the suppressive contact structure being simplified much more. In this case, since the flexibility of the output bus bar 18 is utilized, it is preferable to treat flat surface finishing on both contacting surfaces of the chip carrier 11 and the output bus bar 18, by taking the change in parallelism between the two (2) plane surfaces due to that flexibility into the consideration. Also, because of the same reason, it is preferable for the electrical connection between the output bus bar 18 and the output bus bar 16 to use connecting wire 17 of soft or flexible structure, such as, an aluminum wire or a copper foil, for example.

Figure 12:
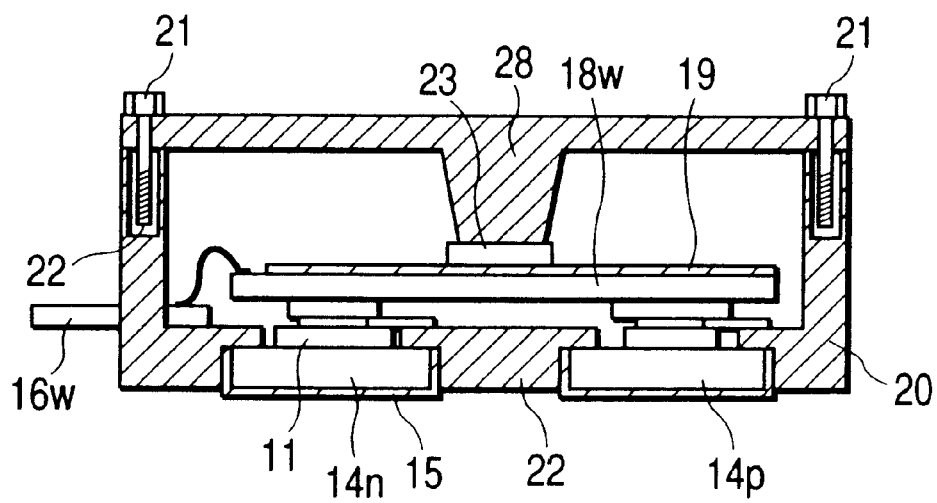
FIG. 12 is a cross-section view for showing the structure of an electric power conversion/inversion apparatus, according to a fourth embodiment of the present invention.

Next, explanation will be given on a fourth embodiment of the electric power conversion/inversion apparatus according to the present invention, by referring to FIG. 12. The FIG. 12 is a cross-section view for showing the structure of the electric power conversion/inversion apparatus, according to the fourth embodiment of the present invention.

According to the present embodiment, in the construction of the first embodiment, the chip carriers 11 are suppressed with using a case cover 28, and the case 20 and the case cover 28 are fixed between them by means of the joint means (such as, the bolt, etc.) 21. With the present structure, since the joint means necessary for suppression can be shared by a sealing means for preventing the inverter module from being contaminated inside thereof, in common, it is possible to realize the inverter module, being superior in the characteristic of hostile-environment further more. Also, the three (3) output bus bars 18 are suppressed by only one (1) case cover 28, it is possible to simplify the suppressing mechanism.

Figure 13:
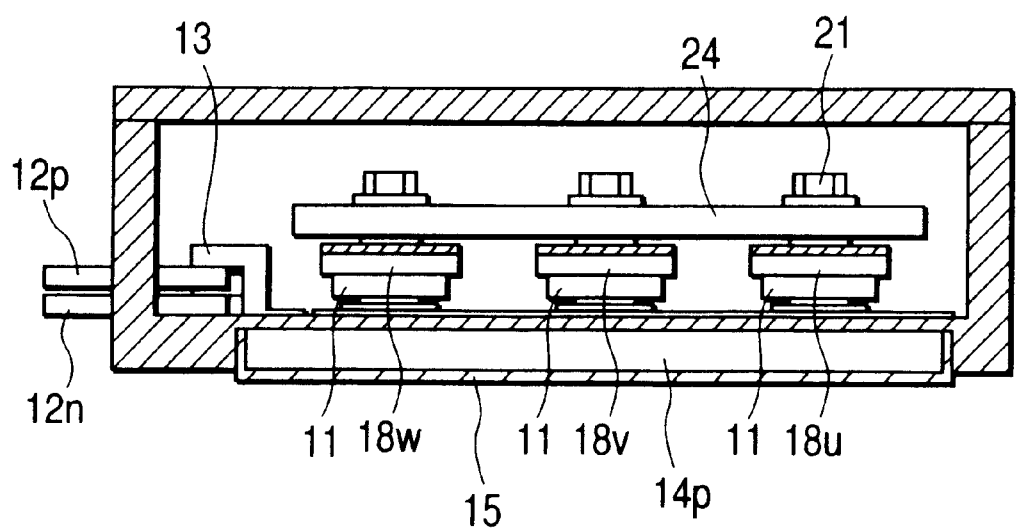
FIG. 13 is a cross-section view for showing the structure of an electric power conversion/inversion apparatus, according to a fifth embodiment of the present invention.

Next, explanation will be given on a fifth embodiment of the electric power conversion/inversion apparatus according to the present invention, by referring to FIG. 13. The FIG. 13 is a cross-section view for showing the structure of the electric power conversion/inversion apparatus, according to the fourth embodiment of the present invention.

According to the present embodiment, the suppression bodies 24 for suppressing each of the output bus bars 18 are integrated in one body, and further it is made of the material of a metal. With this, the suppression body 24 comes to be a metal plate of covering the six (6) chip carriers 11 as a whole, so as to function as a shield against an electromagnetic wave generated when the semiconductor chip 1 is switched over, therefore it can achieve a roll of preventing the controller substrate 104 (see the FIG. 7), etc., which is provided in the vicinity of the inverter module, from mal function thereof.

Figure 14:
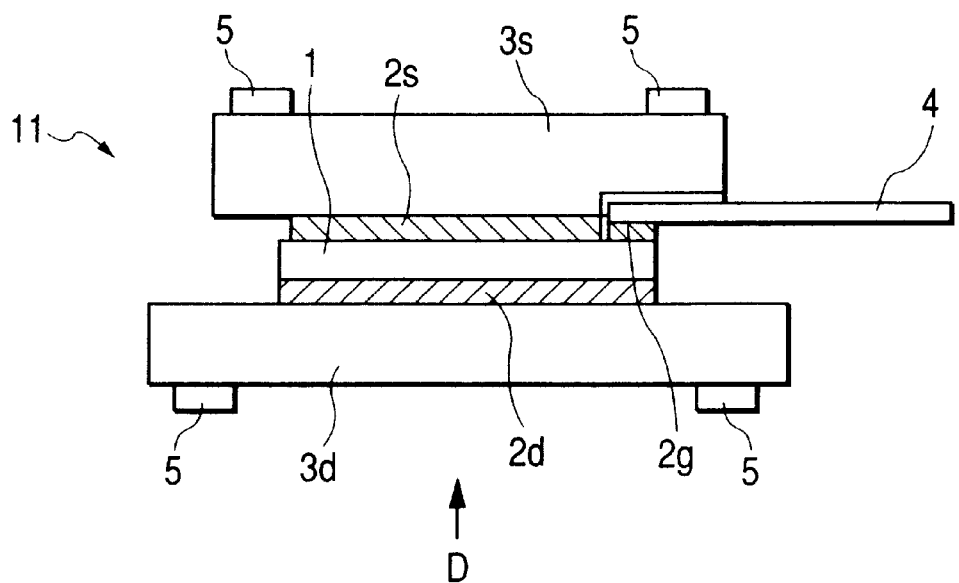
FIG. 14 is a cross-section view for showing the structure of a chip carrier in an electric power conversion/inversion apparatus, according to a sixth embodiment of the present invention.
Figure 15:
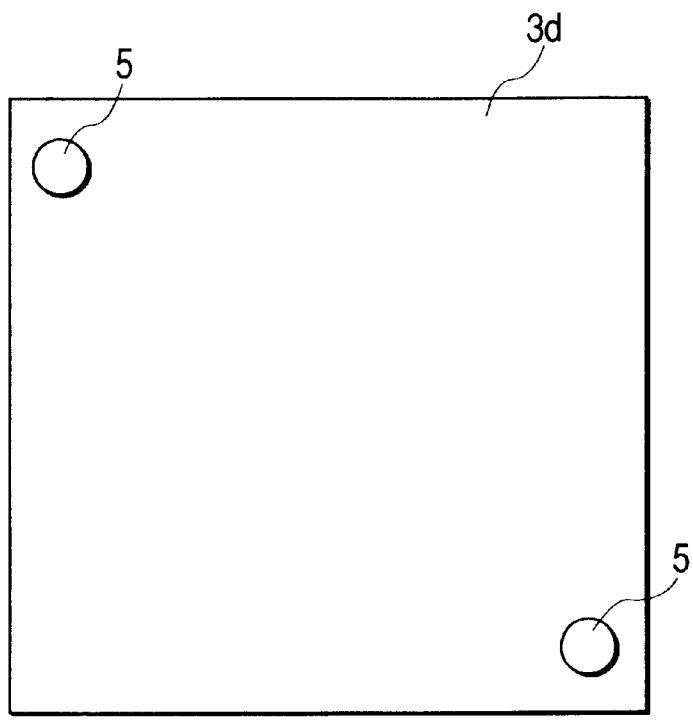
FIG. 15 is a construction view shown in a direction D in the FIG. 14.
Figure 16:
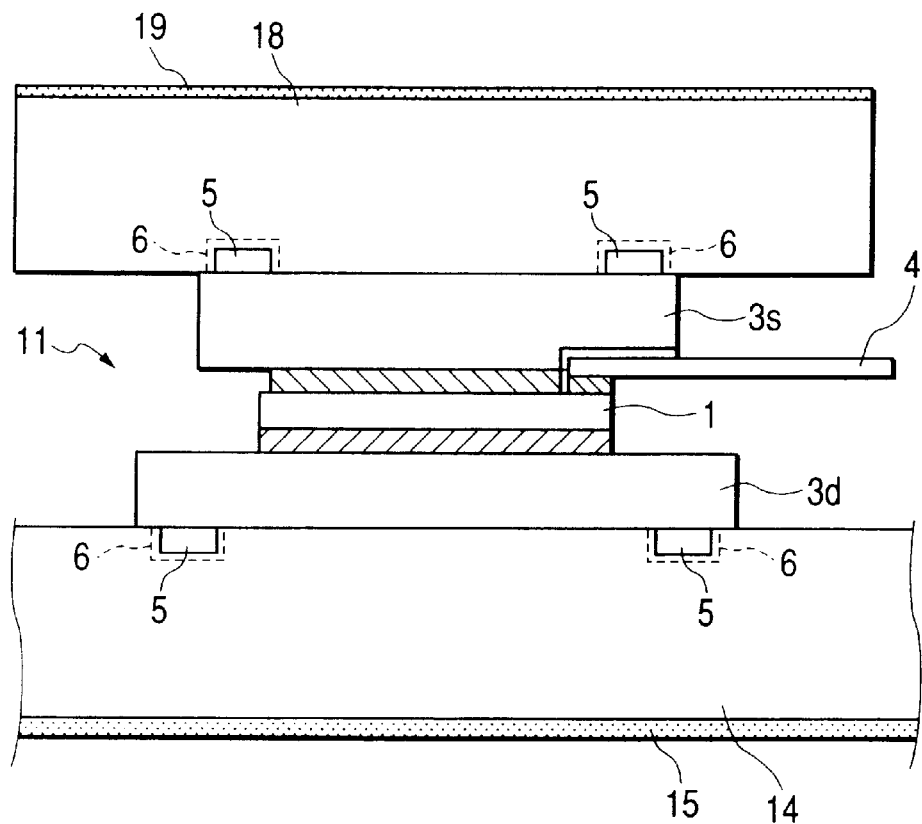
FIG. 16 is across-section view of the construction combining the bus bars with the construction shown in the FIG. 14.

Next, explanation will be given on a sixth embodiment of the electric power conversion/inversion apparatus according to the present invention, by referring to FIGS. 14 through 16. The FIG. 14 is a cross-section view for showing the structure of the chip carrier in the electric power conversion/inversion apparatus, according to the sixth embodiment of the present invention. The FIG. 15 is a construction view seen in a direction D in the FIG. 14. FIG. 16 is a cross-section view of the construction combining the bus bars with the construction shown in the FIG. 14.

According to the present embodiment, a positioning mechanism is provided for the purpose of performing the positioning of the chip carriers 11 with high accuracy, when manufacturing the inverter module. Upon the contact surface of the chip carrier 11 are provided projection portions at least two (2) or more, while engagement portions (for example, openings, etc.) corresponding thereto on the sides of the bus bars 14 and 18. With this, in manufacturing thereof, it is possible to dispose the chip carriers 11 on the input bus bar 14 with high accuracy, and further to combine the output bus bars 18 on the chip carriers 11. The positioning mechanism is preferable to be different in sizes and/or positions thereof, on both surfaces of the chip carrier 11. In more details, in order to disable mounting of the chip carrier 11 even if it is tried with being turned over in the polarity by mistake, or to detect the error with ease, it is desirable to make the distance between two (2) projections or the sizes thereof being different on both surfaces.

Figure 17:
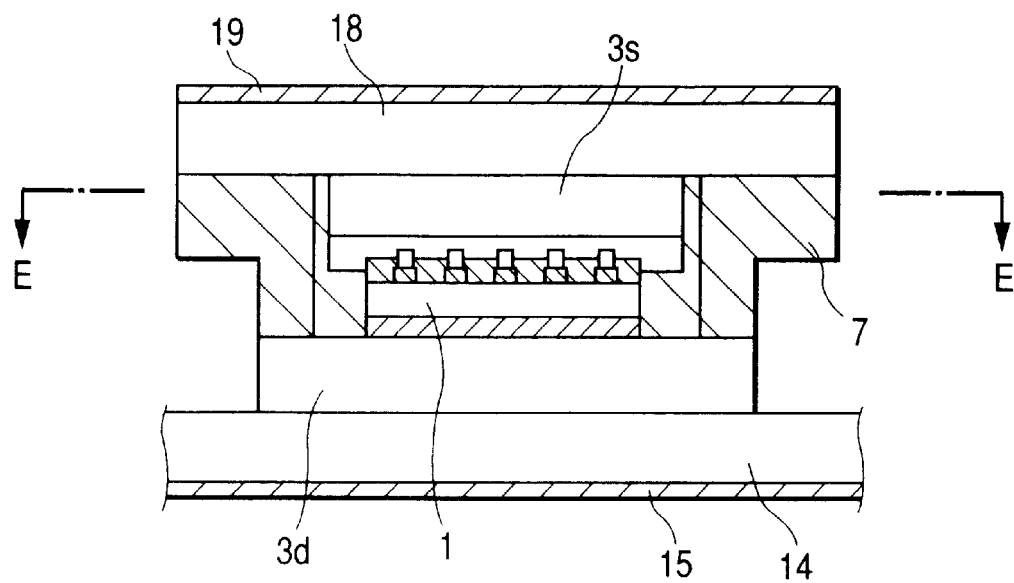
FIG. 17 is a cross-section view for showing the structure of a chip carrier portion in an electric power conversion/inversion apparatus, according to a seventh embodiment of the present invention.
Figure 18:
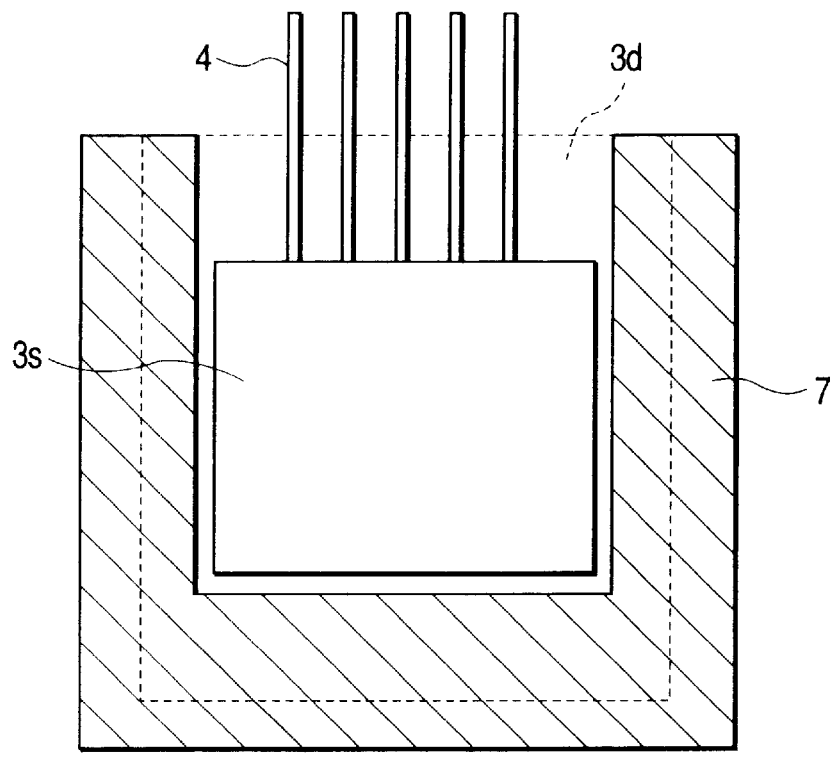
FIG. 18 is across-section view along E—E cross-section plane shown in the FIG. 17.

Next, explanation will be given on a seventh embodiment of the electric power conversion/inversion apparatus according to the present invention, by referring to FIGS. 17 and 18. The FIG. 17 is a cross-section view for showing the structure of a chip carrier portion in the electric power conversion/inversion apparatus, according to a seventh embodiment of the present invention. The FIG. 18 is a cross-section view along E—E cross-section shown in the FIG. 17.

According to the present embodiment, a pressure guide 7 is inserted between the chip carriers 11 and the output bus bars 18, so as to minimize the suppression force applied onto the semiconductor chips 1 comparing to the suppression force generated upon the contact surface between the chip carriers 11 and the input bus bars 18. With this, since the suppression force upon the chip carriers 11 and the bus bars 18 can be made larger than the suppression limit of the semiconductor chips 1, the contact thermal resistance and the contact electrical resistance can be reduced.

Figure 19:
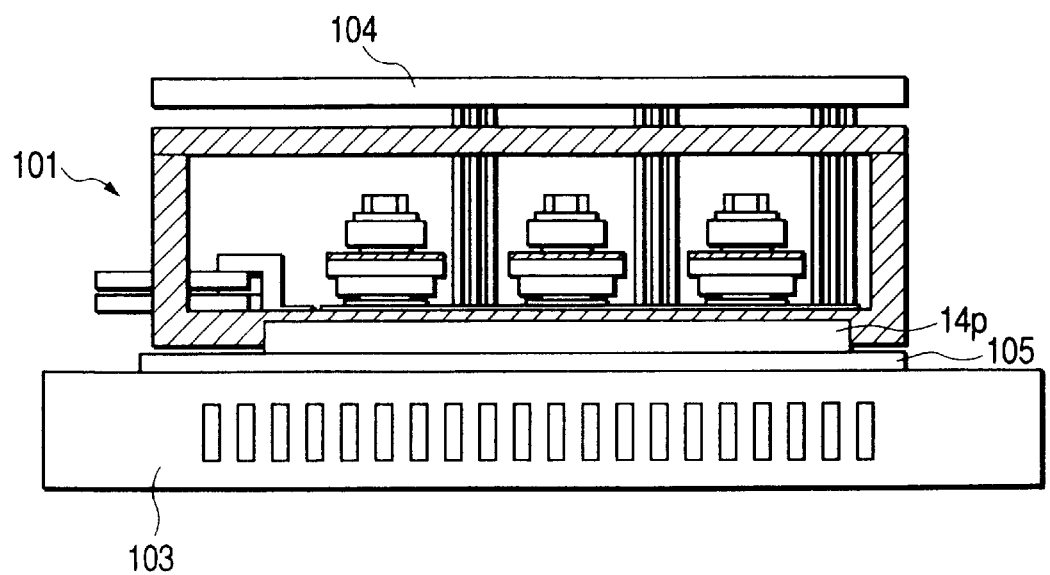
FIG. 19 is a cross-section view for showing the structure of an electric power conversion/inversion apparatus, according to an eighth embodiment of the present invention.

Next, explanation will be given on an eighth embodiment of the electric power conversion/inversion apparatus according to the present invention, by referring to FIG. 19. The FIG. 19 is a cross-section view for showing the structure of the electric power conversion/inversion apparatus, according to the eighth embodiment of the present invention.

According to the present embodiment, without provision of the insulator layer upon the cooling surface of the input bus bars 14, but in place thereof are inserted the input bus bars 14 and an insulator seat 105 detachable between the heat sink 103. With this, change in dielectric strength of insulation can be done easily by changing the endurance voltage of the elements, thereby obtaining an inverter module structure being common to the modules of elements, having different endurance voltages other than the MOSFET.

Figure 20:
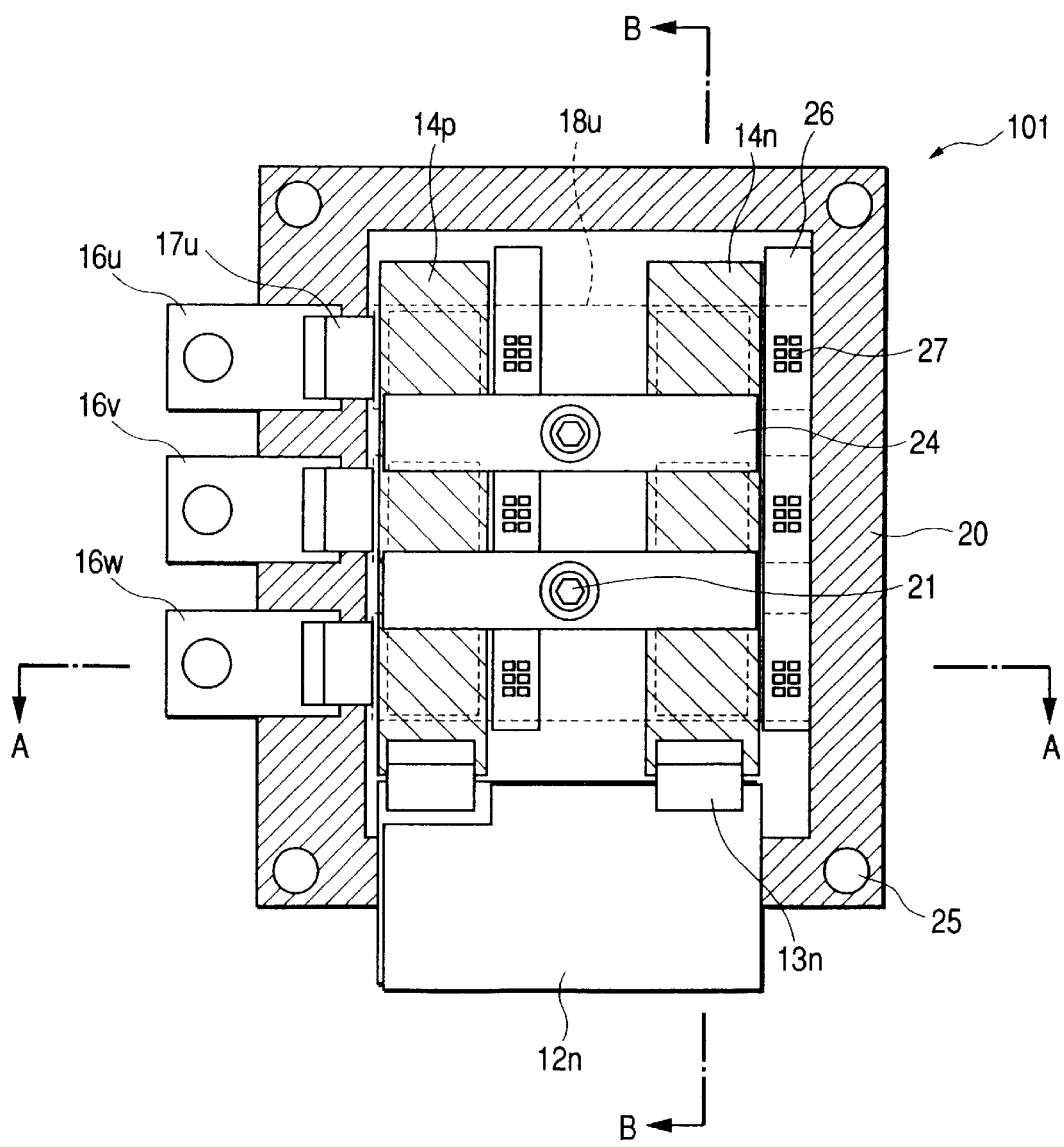
FIG. 20 is a cross-section view for showing the structure of an electric power conversion/inversion apparatus, according to a ninth embodiment of the present invention.
Figure 21:
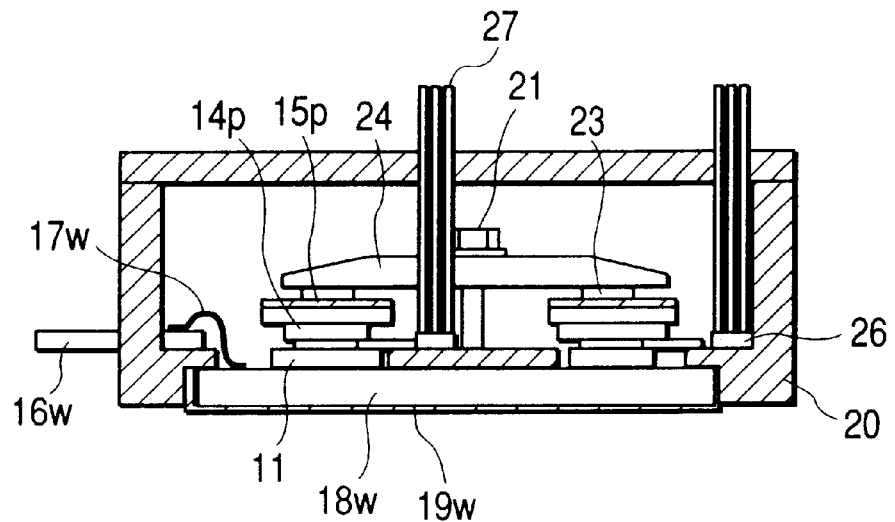
FIG. 21 is a cross-section view along A—A plane shown in the FIG. 20.
Figure 22:
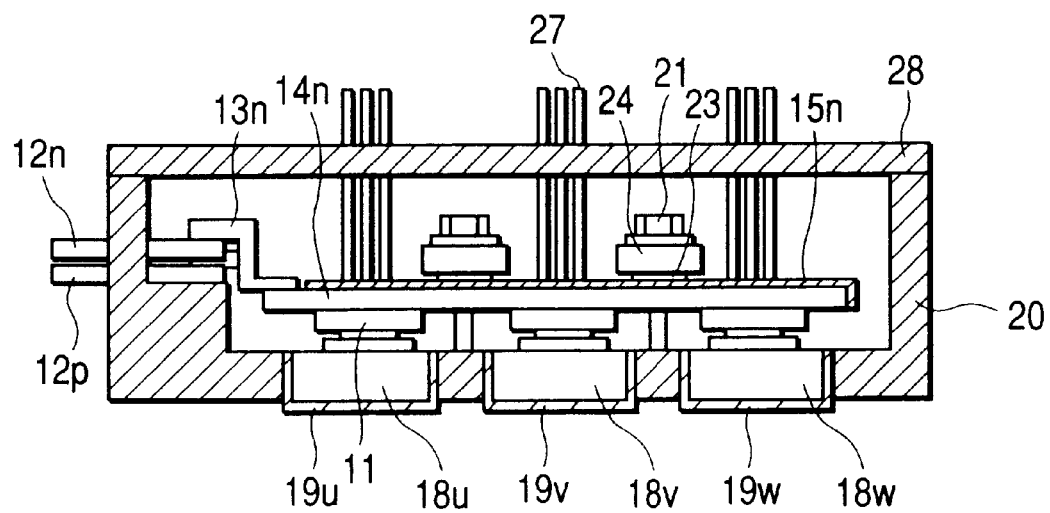
FIG. 22 is a cross-section view along B—B plane shown in the FIG. 20.

Next, explanation will be given on a ninth embodiment of the electric power conversion/inversion apparatus according to the present invention, by referring to FIGS. 20 through 22. The FIG. 20 is a cross-section view for showing the structure of the electric power conversion/inversion apparatus, according to the ninth embodiment of the present invention. The FIG. 21 is a cross-section view along A—A plane shown in the FIG. 20. The FIG. 22 is a cross-section view along B—B plane shown in the FIG. 20.

According to the present embodiment, it is turned over in the order of lamination of the output bus bars 18 and the input bus bars 14, contrarily to that shown in the FIG. 1. In more detail, the output bus bar 18 has the cooling surface thereon. In this instance, though the cooling performance is decreased down comparing to the first embodiment, since the input bus bars 14, which gives large influence upon the inductance, do not contribute to the cooling performance so much, therefore being providing the structure being suitable in a case where the inductance must be small further more.

In the embodiments mentioned heretofore, although there was shown only the example, in which one (1) piece of MOSFET is installed within the chip carrier 11, of course it is also possible to install a plural number of the semiconductor switching elements within the one (1) chip carrier 11, or to form one switching circuit through parallel connection of a plural number of the chip carriers 11. Furthermore, it is also possible to eliminate the low thermal expansion metal member, which is used in the chip carrier, by treating a process for protecting the electrode surface of the semiconductor switching element from the deterioration due to the elapse of time, or to substitute a metal foil having a similar function, which is inserted into, for the low thermal expansion metal member after it is eliminated.

In the embodiments explained heretofore, the semiconductor chips 1 are disposed to be put between the positive input bus bar 14p and the negative input bus bar 14n and the output bus bars 18, at crossing positions thereof, and are connected, electrically and thermally, to the positive input bus bar 14p in a pole direction consistent therewith while to the negative input bus bar 14n in a pole direction consistent therewith, and further to the common output bus bars 18 in pole directions being different from side by side, therefore, the neighboring semiconductor chips, the neighboring input bus bars 14 and the neighboring output bus bars 18 can be disposed in the vicinity thereof, respectively, so as to brig it to be very compact as a whole. With this, it is possible to obtain a good installability of the electric power conversion/inversion apparatus, as well as to obtain reduction of the circuit inductance and the wiring resistance. With this reduction of the circuit inductance, it is possible to suppress the jump-up of voltage when the semiconductor-switching element is switched over, so as to protect from the breakage thereof, and therefore it is possible to provide the electric power conversion/inversion apparatus having high reliability, as well as that having high efficiency of electric power conversion due to the decrease of the wiring resistance thereof.

Also, the positive input bus bar 14p and the negative input bus bar 14n are connected to a positive input terminal 12p and a negative input terminal 12n, which are formed in a laminated manner, from the same side in the longitudinal direction thereof, respectively, while the output bus bars 18 are connected to output terminals 16, respectively, from a side being same thereto but different from that of the positive and the negative input terminals 12p and 12n, in the longitudinal direction thereof, therefore it is possible to enlarge a lamination area of the positive input terminal 12p and the negative input terminal 12n, by utilizing spaces between the positive input bus bar 14p and the negative input bus bar 14n, which are disposed in parallel without restriction due to the output terminals 16. With this, it is possible to obtain the reduction of the circuit inductance, further more.

And, a semiconductor chip carrier 11 is constructed with the semiconductor chip 1 having a semiconductor-switching element therein and metal members 3 connected to a positive and a negative electrode surfaces on both sides of the semiconductor chip 1, and the semiconductor chips are disposed to be put between the positive input bus bar 14p and the negative input bus bar 14n and the output bus bars 18, at crossing positions thereof, and are connected, electrically and thermally, to the positive input bus bar 14p in a pole direction consistent therewith while to the negative input bus bar 14n in a pole direction consistent therewith, and further to the common output bus bars 18 in pole directions being different from side by side, thereby obtaining the thermal and the electrical connection between the semiconductor chip 1 and the input and output bus bars 14 and 18 on both sides thereof through the metal members 3, at high efficiency and with certainty, while keeping a total body compact and the low circuit inductance and the low resistance, ensuring certainty and reliability in the operation of the semiconductor switching elements, and enabling a protection of the electrode surfaces of the semiconductor chip 1, being most sensitive to contamination from the elapse of time, by sealing them by the metal member 3.

The metal member 3 is formed of a low thermal expansion metal material having a low linear thermal expansion coefficient being near to that of the semiconductor chip 1, and is connected to the semiconductor chip 1 through soldering 2 for use in connection, thereby constructing semiconductor chip carrier 11, therefore, the difference between the semiconductor chip land the metal member 3 comes to be small in an amount of change in the thermal expansion thereof, thereby mitigate thermal fatigue applied onto soldering 2 for use in connection. With this, it is possible to protect the semiconductor chip carrier 11 from the destruction due to the thermal fatigue thereof.

Furthermore, the metal member 3 has an area being larger than that of a projection area of the semiconductor chip, and a thickness thereof is thin, about from 1 mm to 2 mm in thickness thereof, therefore it is possible to diffuse heat generated from the semiconductor chip 1 widely in a direction of the plane thereof, and also to make small a use amount of the low thermal expansion metal material 3, which is high in a price in general.

And, a suppression mechanism is provided for suppressing the input bus bars 14 and the output bus bars 18 onto the semiconductor chi carriers 11, therefore it is possible to connect the input bus bars 14 and the output bus bars 18 onto the semiconductor chi carriers 11, electrically and thermally, without through the connecting solder, etc., as well as, to dissolve problems due to the thermal fatigue of the connecting solder, thereby enabling to manufacture the apparatus easily and cheaply.

And, the input bus bars 14 and the output bus bars 18 are molded with the case 20 in one body when it is formed of plastic, and the cooler 103 is connected thermally through the electrical insulating layer on the surface of the side opposing to the semiconductor chip carriers 11 (i.e., an unti-semiconductor chip carrier side), on which the input bus bars 14 or the output bus bars 18 are exposed, therefore it is possible to protect the semiconductor chip carriers 11 from the contamination due to dust of an outside thereof, and at the same time, to cool the semiconductor chip carriers 11 within the case 20 through the input bus bars 14 or the output bus bars 18, with certainty, and to ensure the reliability of the semiconductor chip carriers 11.

Also, the input bus bars 14 or the output bus bars 18, which are formed with the case 20 in one body, constitutes a suppressing mechanism for suppressing the output bus bars 18 or the input bus bars 14 provided on the opposing side thereof, therefore obtaining the suppression with a simple structure.

As was fully explained in the above, according to the present invention, there is provided the electric power conversion/inversion apparatus, achieving reduction in the circuit inductance and the wiring resistance thereof, while bringing the apparatus to be compact in sized as a whole, thereby accomplishing the electric conversion/inversion apparatus having a good installation, as well as a high reliability and an efficiency in the electric power conversion/inversion.

Also, according to the present invention, there is provided the electric power conversion/inversion apparatus, obtaining reduction in the circuit inductance and the wiring resistance thereof, and also mitigation of the thermal fatigue against the thermal cycle, while bringing the apparatus to be compact in sized as a whole, thereby accomplishing the electric conversion/inversion apparatus having a good installation, as well as a high reliability and a high efficiency in the electric power conversion/inversion.

Furthermore, according to the present invention, there is provided the electric power conversion/inversion apparatus, obtaining reduction in the circuit inductance and the wiring resistance thereof, and also protection of the electrode surfaces of the semiconductor chips from deterioration due to elapse of time, while bringing the apparatus to be compact in sized as a whole, thereby accomplishing an electric conversion/inversion apparatus having a good installation, as well as a high reliability and a high efficiency in the electric power conversion/inversion.

What is claimed is:

1. An electric power conversion/inversion apparatus, comprising:

a plural number of input bus bars for inputting electric power from an outside;

a plural number of output bus bars for outputting electric power to the outside; and a plural number of semiconductor chips, being electrically connected to said input bus bars and said output bus bars for converting/inverting the electric power inputted into an output, wherein said plural number of input bus bars include a positive input bus bar and a negative input bus bar, being provided extending in parallel to each other, while said plural number of output bus bars are provided extending in parallel to each other and crossing over said positive and said negative input bus bars in longitudinal directions thereof, said plurality of semiconductor chips are disposed, being put between said positive input bus bar and said negative input bus bar and said plurality of output bus bars at crossing positions thereof, and connected electrically and thermally, to said positive input bus bar in a pole direction consistent therewith while to said negative input bus bar in a pole direction consistent therewith, and further to said common output bus bars in pole directions being different from side by side.

2. An electric power conversion/inversion apparatus, as defined in the claim 1, wherein said positive input bus bar and said negative input bus bar are elongated in a manner of a straight line and disposed in parallel to each other upon a same plane, while said output bus bars are elongated in a manner of a straight line and disposed in parallel to each other upon a same plane, so that said output bus bars cross over said positive and said negative input bus bars at about right angles, in the longitudinal directions thereof.

3. An electric power conversion/inversion apparatus, as defined in the claim 1, wherein said positive input bus bar and said negative input bus bar are connected to a positive input terminal and a negative input terminal, being formed in a laminated manner, from a side being same in the longitudinal direction thereof, respectively, while said plural number of output bus bars are connected to output terminals, respectively, from a side being same thereto but different from that of the positive and the negative input terminals, in the longitudinal direction thereof.

4. An electric power conversion/inversion apparatus, as defined in the claim 1, wherein said semiconductor chips, each one being constructed with a MOSFET having a semiconductor switching element and a diode connected thereto in reverse-parallel direction, are connected between said input bus bars and said output bus bars, while said output bus bars being formed three in number, so that said semiconductor chips form a three-phase bridge, thereby inverting DC electric power inputted into three-phase AC electric power.

5. An electric power conversion/inversion apparatus, comprising:

a plural number of input bus bars for inputting electric power from an outside;

a plural number of output bus bars for outputting electric power to the outside; and a plural number of semiconductor chip carriers, being electrically connected to said input bus bars and said output bus bars for converting/inverting the electric power inputted into an output, wherein said plural number of input bus bars include a positive input bus bar and a negative input bus bar, being provided extending in parallel to each other, while said plural number of output bus bars are provided extending in parallel to each other and crossing over said positive and said negative input bus bars in longitudinal directions thereof, said plurality of semiconductor chip carriers, each having a semiconductor chip including a semiconductor switching element therein and a metal member being electrically and thermally connected to a positive surface and a negative surface on both sides of said semiconductor chip, are disposed, being put between said positive input bus bar and said negative input bus bar and said plurality of output bus bars at crossing positions thereof, and connected electrically and thermally, to said positive input bus bar in a pole direction consistent therewith while to said negative input bus bar in a pole direction consistent therewith, and further to said common output bus bars in pole directions being different from side by side.

6. An electric power conversion/inversion apparatus, as defined in the claim 5, wherein said metal member is formed of a low thermal expansion metal material having a low linear thermal expansion coefficient being near to that of said semiconductor chip, and is connected to said semiconductor chip through a bonding material.

7. An electric power conversion/inversion apparatus, as defined in the claim 6, wherein said metal member is formed of a low thermal expansion metal material having a low linear thermal expansion coefficient within a range from 3 to 10.

8. An electric power conversion/inversion apparatus, as defined in the claim 5, wherein a projection portion and an engagement portion of said semiconductor chip carrier and said input bus bar or said output bus bar are engaged, thereby providing a positioning mechanism for fixing both positions.

9. An electric power conversion/inversion apparatus, as defined in the claim 5, wherein said metal member has an area being larger than that of a projection area of said semiconductor chip, and a thickness thereof is thin, around from 1 mm to 2 mm in thickness thereof.

10. An electric power conversion/inversion apparatus, comprising:

a plural number of input bus bars for inputting electric power from an outside;

a plural number of output bus bars for outputting electric power to the outside;

a plural number of semiconductor chip carriers, being electrically connected to said input bus bars and said output bus bars for converting/inverting the electric power inputted into an output; and a suppression mechanism for suppressing said input bus bars and said output bus bars onto said semiconductor chip carriers, wherein said plural number of input bus bars include a positive input bus bar and a negative input bus bar, being provided extending in parallel to each other, while said plural number of output bus bars are provided extending in parallel to each other and crossing over said positive and said negative input bus bars in longitudinal directions thereof, said plurality of semiconductor chip carriers, each having a semiconductor chip including a semiconductor switching element therein and a low thermal expansion metal member being electrically and thermally connected to a positive surface and a negative surface on both sides of said semiconductor chip, are disposed, being put between said positive input bus bar and said negative input bus bar and said plurality of output bus bars at crossing positions thereof, and connected electrically and thermally, to said positive input bus bar in a pole direction consistent therewith while to said negative input bus bar in a pole direction consistent therewith, and further to said common output bus bars in pole directions being different from side by side.

11. An electric power conversion/inversion apparatus, as defined in the claim 10, wherein a ratio between a width and a thickness of said input bus bar is set within a range from 5 to 10.

12. An electric power conversion/inversion apparatus, comprising:

a plural number of input bus bars for inputting electric power from an outside;

a plural number of output bus bars for outputting electric power to the outside;

a plural number of semiconductor chip carriers, being electrically connected to said input bus bars and said output bus bars for converting/inverting the electric power inputted into an output;

a case for having said and semiconductor chip carriers built-in; and a cooler for cooling said plural number of input bus bars or said plural number of output bus bars, wherein said plural number of input bus bars and said plural number of output bus bars are provided so that they intersect to each other, said plurality of semiconductor chip carriers, each having a semiconductor chip including a semiconductor switching element therein and a metal member being electrically and thermally connected to a positive and a negative surfaces on both sides of said semiconductor chip, are disposed, being put between said input bus bars and said plurality of output bus bars at crossing positions thereof, and connected electrically and thermally, to said positive input bus bar in a pole direction consistent therewith while to said negative input bus bar in a pole direction consistent therewith, and further to said common output bus bars in pole directions being different from side by side, said case, being made of plastic as a whole, is molded with said input bus bars or said output bus bars in one body with exposing surfaces thereof on anti-semiconductor side, when being formed from the plastic, and said cooler is disposed on an outside said case, being connected thermally to a surface of the anti-semiconductor side, on which said input bus bars or said output bus bars are exposed, through an electric insulator layer.

13. An electric power conversion/inversion apparatus, as defined in the claim 12, wherein suppression mechanisms are provided onto said input bus bars or said output bus bars, which are molded with said case in one body, so as to suppress said output bus bars or said input bus bars.

14. An electric power conversion/inversion apparatus, comprising:
- a plural number of input bus bars for inputting DC electric power from a battery;
- a plural number of output bus bars for outputting electric power to an electrical rotating machine for use in an automobile;
- a plural number of semiconductor chip carriers, being electrically connected to said input bus bars and said output bus bars for converting/inverting the DC electric power inputted into three-phase AC output;
- a case for having said and semiconductor chip carriers built-in;
- a cooler for cooling said plural number of input bus bars or said plural number of output bus bars; and
- a suppression mechanism for suppressing said input bus bars and said output bus bars onto said semiconductor chip carriers, wherein, said plural number of input bus bars, including a positive input bus bar and a negative input bus bar therein, and said plural number of output bus bars being provided three in number thereof, are disposed, so that they intersect each other, said plurality of semiconductor chip carriers, each having a semiconductor chip, including a semiconductor switching element and a diode connected in a reverse-parallel direction thereto in a form of MOSFET, and a metal member being electrically and thermally connected to a positive and a negative surfaces on both sides of said semiconductor chip, are disposed, being put between said input bus bars and said plurality of output bus bars at crossing positions thereof, and connected electrically and thermally, to said positive input bus bar in a pole direction consistent therewith while to said negative input bus bar in a pole direction consistent therewith, and further to said common output bus bars in pole directions being different from side by side, thereby forming a three-phase bridge circuit, said case made of plastic is formed with said input bus bars or said output bus bars in one body when being formed from the plastic, while exposing surfaces thereof on anti-semiconductor side to an outside, said cooler is disposed on an outside of said case, being connected thermally through an electrical insulating layer to the surface on the anti-semiconductor side, on which said input bus bars or said output bus bars are exposed, and said suppression mechanism is provided for suppressing said input bus bars or said output bus bars, which are formed with said case in one body, to said output bus bars or said input bus bars on an opposing side thereto.

\* \* \* \* \*